United States Patent
Subramaniam et al.

(10) Patent No.: US 9,022,790 B1
(45) Date of Patent: May 5, 2015

(54) FIXTURE FOR A DISK DRIVE PRINTED CIRCUIT BOARD

(75) Inventors: Kavitha Subramaniam, Shah Alam (MY); Kooi Hoe Choong, Kuala Lumpur (MY)

(73) Assignee: Western Digital Technologies, Inc., Irvine, CA (US)

( * ) Notice: Subject to any disclaimer, the term of this patent is extended or adjusted under 35 U.S.C. 154(b) by 268 days.

(21) Appl. No.: 13/610,696

(22) Filed: Sep. 11, 2012

(51) Int. Cl.
*H01R 12/00* (2006.01)
*H01R 4/24* (2006.01)

(52) U.S. Cl.
CPC ...................................... *H01R 4/247* (2013.01)

(58) Field of Classification Search
USPC ........ 439/66; 361/784, 790; 324/754.06, 637, 324/210, 754.07
See application file for complete search history.

(56) References Cited

U.S. PATENT DOCUMENTS

| | | | |
|---|---|---|---|
| 6,259,265 B1 * | 7/2001 | Han et al. | 324/754.03 |
| 6,454,572 B1 * | 9/2002 | Konetski et al. | 439/66 |
| 6,570,399 B2 * | 5/2003 | Yeghiayan et al. | 324/755.05 |
| 7,509,224 B2 * | 3/2009 | Holwell et al. | 702/108 |
| 7,705,588 B2 * | 4/2010 | Eaton et al. | 324/210 |
| 2002/0093355 A1 * | 7/2002 | Parker et al. | 324/761 |
| 2003/0042895 A1 * | 3/2003 | Mihara et al. | 324/210 |
| 2007/0143053 A1 | 6/2007 | Holwell et al. | |
| 2010/0201386 A1 * | 8/2010 | Roelvink | 324/754 |
| 2011/0095766 A1 * | 4/2011 | Ogle et al. | 324/537 |

* cited by examiner

*Primary Examiner* — Alexander Gilman

(57) ABSTRACT

A fixture for connecting a printed circuit board for a storage device to a storage device test equipment, the fixture including a body, a first set of contacts located on the body and configured to contact spindle motor contacts on the printed circuit board in a solderless manner, a second set of contacts located on the body configured to contact head stack assembly contacts on the printed circuit board in a solderless manner, and a plurality of alignment posts located on the body and configured to align the first set of contacts with the spindle motor contacts and align the second set of contacts with the head stack assembly contacts.

20 Claims, 6 Drawing Sheets

FIXTURE FOR A DISK DRIVE PRINTED CIRCUIT BOARD

BACKGROUND

Conventionally, disk drive components are tested by connecting a printed circuit board to a storage device test equipment and the disk drive components. To form such a connection, contacts on the printed circuit board are soldered to wires, which are electrically connected to the storage device test equipment and the disk drive components.

However, soldering the wires to the printed circuit board can damage the printed circuit board due to the high temperature of the soldering gun. Furthermore, the wires may be soldered incorrectly onto the printed circuit board. Unfortunately, the detection of such problems may not occur until the printed circuit board is already connected to the storage device test equipment and in use for the testing of the disk drive components. This can require additional time to replace the printed circuit board or resolder the wires.

Even when the wires are soldered correctly onto the printed circuit board, such a soldered connection may be prone to displacement during use, requiring a resolder of the wires or a replacement of the printed circuit board. Furthermore, the printed circuit board which has wires soldered to it generally has a short life cycle and is subject to a high burn out rate. When the printed circuit board is burned out, it would have to be replaced. Furthermore, the printed circuit board which has wires soldered to it may have an unstable current flow in the printed circuit board. This may cause the disk drive components to have unstable timing or actuation.

BRIEF DESCRIPTION OF THE DRAWINGS

The features and advantages of the present embodiments will become more apparent from the detailed description set forth below when taken in conjunction with the drawings, wherein.

DETAILED DESCRIPTION

Figure 1:
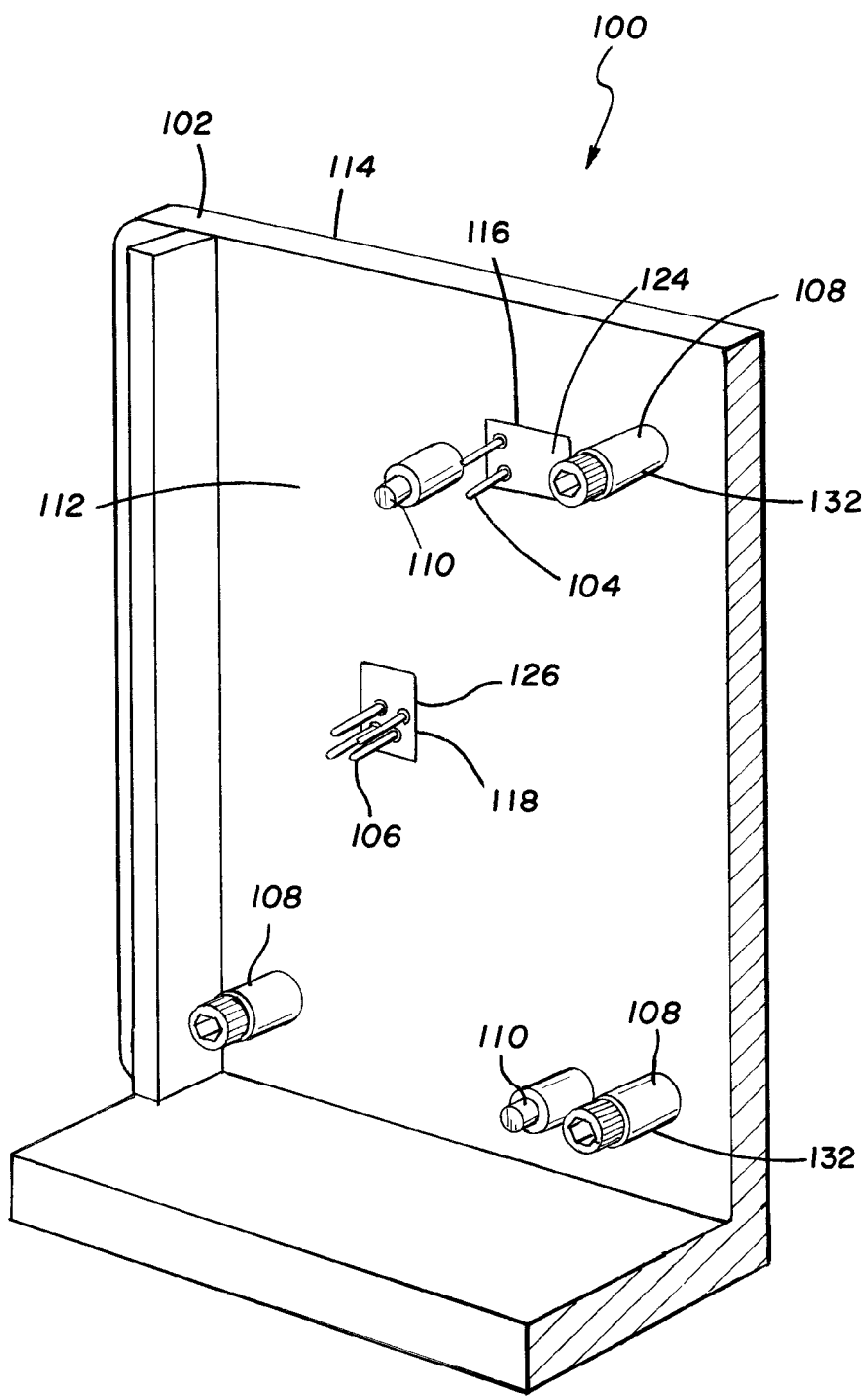
FIG. 1 depicts a fixture for connecting a printed circuit board for a storage device to a storage device test equipment according to an embodiment.

In an embodiment, as shown in FIG. 1, a fixture 100 includes a body 102 having a first side 112 and a second side 114 opposite the first side 112. In an embodiment, the fixture 100 can be secured to a printed circuit board (not shown in FIG. 1), which will be described in more detail later in conjunction with FIG. 5. The printed circuit board can be, for example, a disk drive printed circuit board. In an embodiment, the printed circuit board can be used to control, and hence test, various disk drive components including a spindle motor of the disk drive, and a head stack assembly of the disk drive. The fixture 100 enables the printed circuit board to be electrically connected to a test equipment in a solderless manner.

In an embodiment, the body 102 is formed from a heat resistant and insulating material. For example, the heat resistant and insulating material can be formed from acetal resin. In an embodiment, the acetal resin can be Dupont™ Delrin®.

Figure 2:
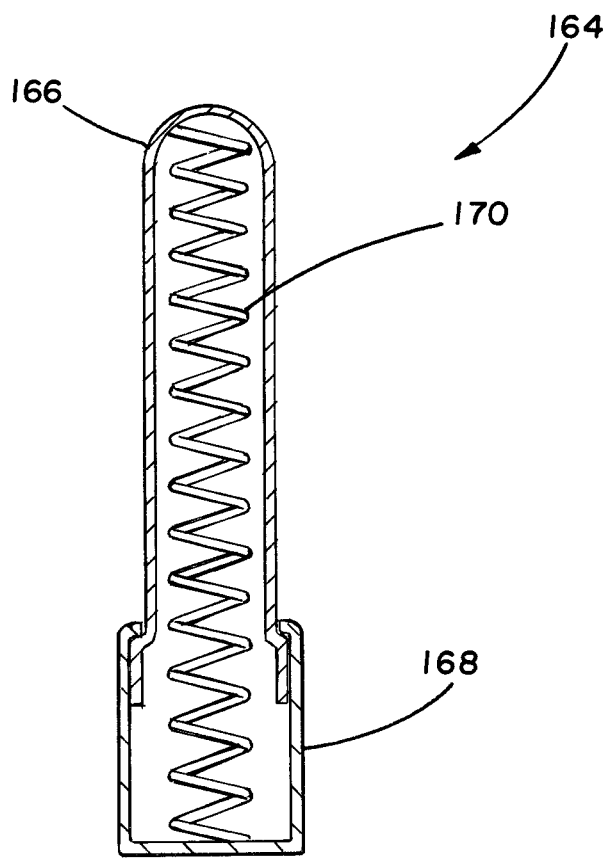
FIG. 2 depicts a pogo pin according to an embodiment.

The fixture 100 includes a first set of contacts 104 and a second set of contacts 106 located on the body 102. The first set of contacts 104 are configured to contact spindle motor contacts on the printed circuit board in a solderless manner, while the second set of contacts 106 are configured to contact head stack assembly contacts on the printed circuit board in a solderless manner. In an embodiment, the first set of contacts 104 and the second set of contacts 106 are biased pins such as spring loaded pins. In an embodiment shown in FIG. 2, the first set of contacts 104 and the second set of contacts 106 are pogo pins 164. As seen in FIG. 2, a pogo pin 164 includes a top portion 166 and a bottom portion 168 where the top portion 166 is biased away from the bottom portion 168 by a biasing member 170. However, the top portion 166 can be depressed such that it becomes closer to the bottom portion 168. In an embodiment, the biasing member 170 is a spring.

In an embodiment, the top portion 166 is used to contact the spindle motor contacts or the head stack assembly contacts. Thus, the first set of contacts 104 and the second set of contacts 106 can be biased to contact the spindle motor contacts and the head stack assembly in a solderless manner. Furthermore, in an embodiment, the top portion 166 and the bottom portion 168 are electrically connected so that electrical signals from the contacted spindle motor contacts or the contacted head stack assembly contacts will pass through the pogo pins 164.

In an embodiment, an amount of biasing provided by the biasing member 170 can be sufficient to maintain contact between the first set of contacts 104 and the spindle motor contacts, and to substantially maintain contact between the second set of contacts 106 and the head stack assembly contacts despite an impact to the printed circuit board or the fixture 100. In an embodiment, such contact can be maintained when the impact has a force less than a predetermined maximum amount of force. The biasing of the biasing member 170 can be adjusted, for example, to increase or decrease the desired predetermined maximum amount of force. In an embodiment, the amount of biasing provided by the biasing member 170 need not be uniform for the first set of contacts 104 and the second set of contacts 106. That is, the biasing members 170 in the pogo pins 164 of the first set of contacts 104 can have a first amount of biasing and the biasing members 170 in the pogo pins 164 of the second set of contacts 106 can have a second amount of biasing that is different from the first amount of biasing. In an embodiment, the biasing members 170 in the pogo pins 164 in the first set of contacts 104 need not be uniform with each other. Likewise, the biasing members 170 in the pogo pins 164 in the second set of contacts 106 need not be uniform with each other.

The fixture 100 also includes a connection unit 116 which receives the first set of contacts 104 at a first side 124 of the connection unit 116, and a connection unit 118 which receives the second set of contacts 106 at a first side 126 of the connection unit 118.

As seen in FIG. 1, the fixture 100 also includes securing members 108 and alignment posts 110. In an embodiment, the alignment posts 110 align the fixture 100 with the printed circuit board while the securing members 108 secure the printed circuit board to the fixture 100. In an embodiment the alignment posts 110 comprise acetal resin, plastic, or metallic materials. In an embodiment, the acetal resin is Dupont™ Delrin®.

Figure 3:
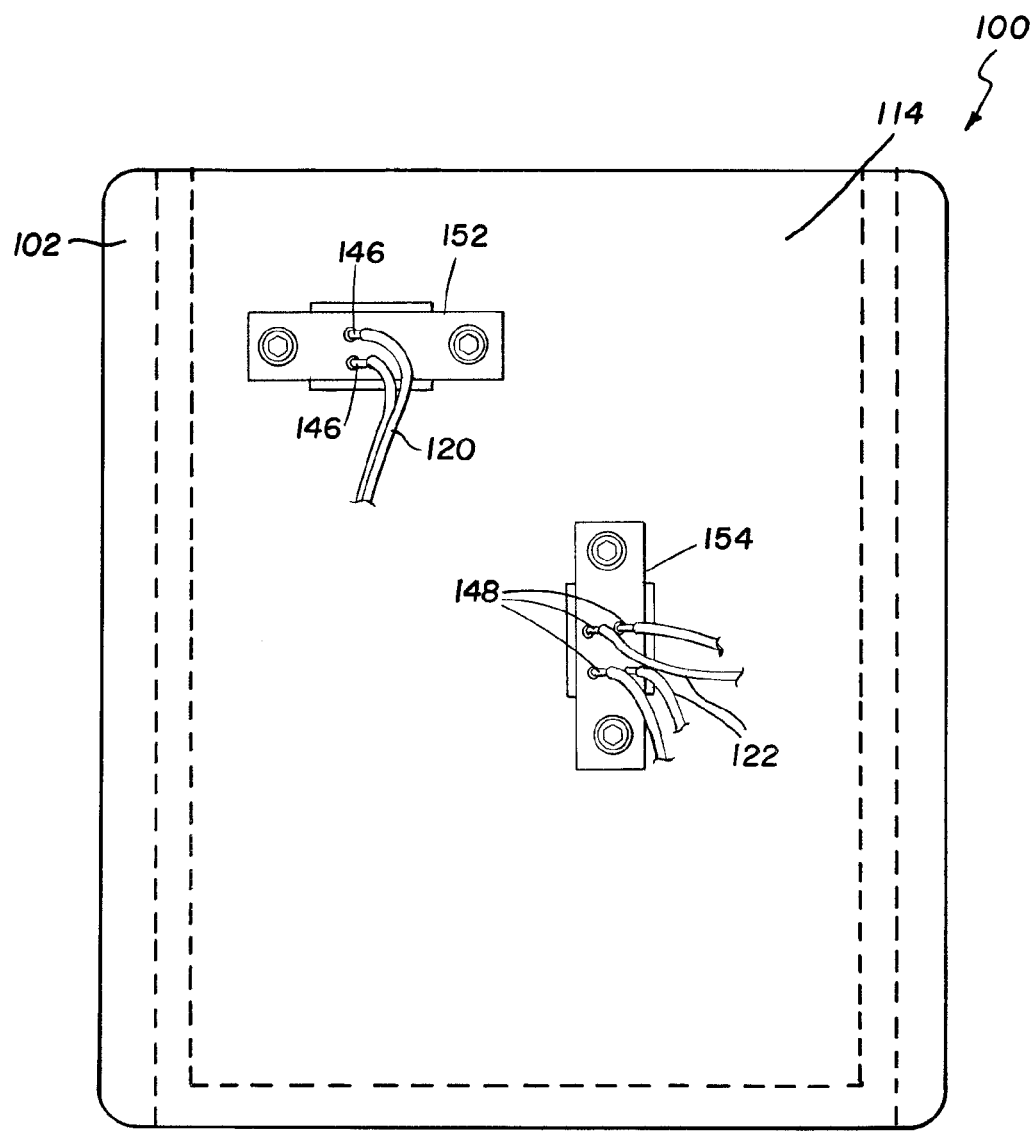
FIG. 3 depicts a side of a fixture for connecting a printed circuit board for a storage device to a storage device test equipment according to an embodiment.

In an embodiment, as seen in FIG. 3, a second side 152 of the connection unit 116 and a second side 154 of the connection unit 118 are located on the second side 114 of the body 102. The second side 152 of the connection unit 116 includes a third set of contacts 146 which are electrically connected to the first set of contacts 104. The third set of contacts 146 are electrically connected to wires 120. The second side 154 of the connection unit 118 includes a fourth set of contacts 148 which are electrically connected to the second set of contacts 106. The fourth set of contacts 148 are electrically connected to wires 122. In an embodiment, the third set of contacts 146 and the fourth set of contacts 148 are not pogo pins. Instead, the third set of contacts 146 and the fourth set of contacts 148 can be stagnant and/or non-biased.

Figure 4:
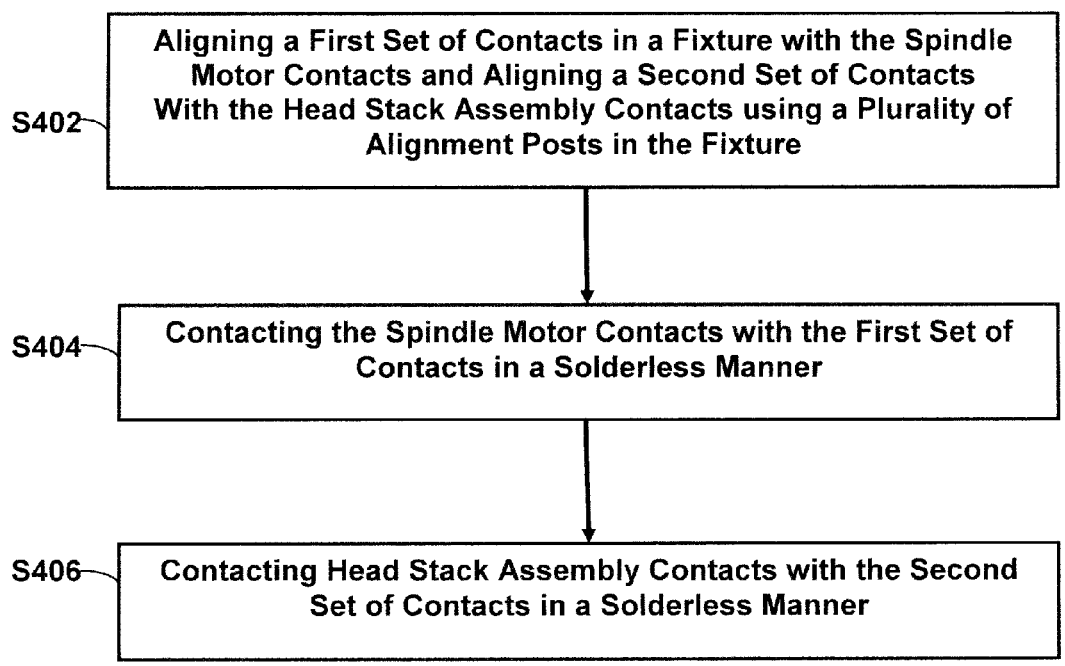
FIG. 4 depicts a process according to an embodiment.

In operation, as seen in FIG. 4, a first set of contacts 104 are aligned with spindle motor contacts on a printed circuit board and a second set of contacts 106 are aligned with head stack assembly contacts on the printed circuit board using a plurality of alignment posts in Block S402. For example, as seen in an embodiment shown in FIG. 5, a printed circuit board 128 includes spindle motor contacts 156, head stack assembly contacts 158, and a plurality of alignment guides 150 corresponding to the alignment posts 110. The plurality of alignment guides 150 are aligned with the alignment posts 110 to align the fixture 100 with the printed circuit board 128 such that the spindle motor contacts 156 are aligned with the first set of contacts 104. In an embodiment, the alignment guides 150 comprise a hole which can receive at least a portion of the alignment posts 110. In an embodiment, such an alignment also ensures that the head stack assembly contacts 158 are aligned with the second set of contacts 106.

In Block S404, the spindle motor contacts 156 contact the first set of contacts 104 in a solderless manner. For example, in FIG. 5, the top portions 166 of the first set of contacts 104 are biased towards the spindle motor contacts 156 by the biasing member 170.

In Block S406, the head stack assembly contacts 158 contact the second set of contacts 104 in a solderless manner. For example, in FIG. 5, the top portions 166 of the second set of contacts 106 are biased towards the head stack assembly contacts 158 by the biasing member 170. In other embodiments, the actions shown in Blocks S402-S406 may be performed in a different order than that which is shown.

Figure 5:
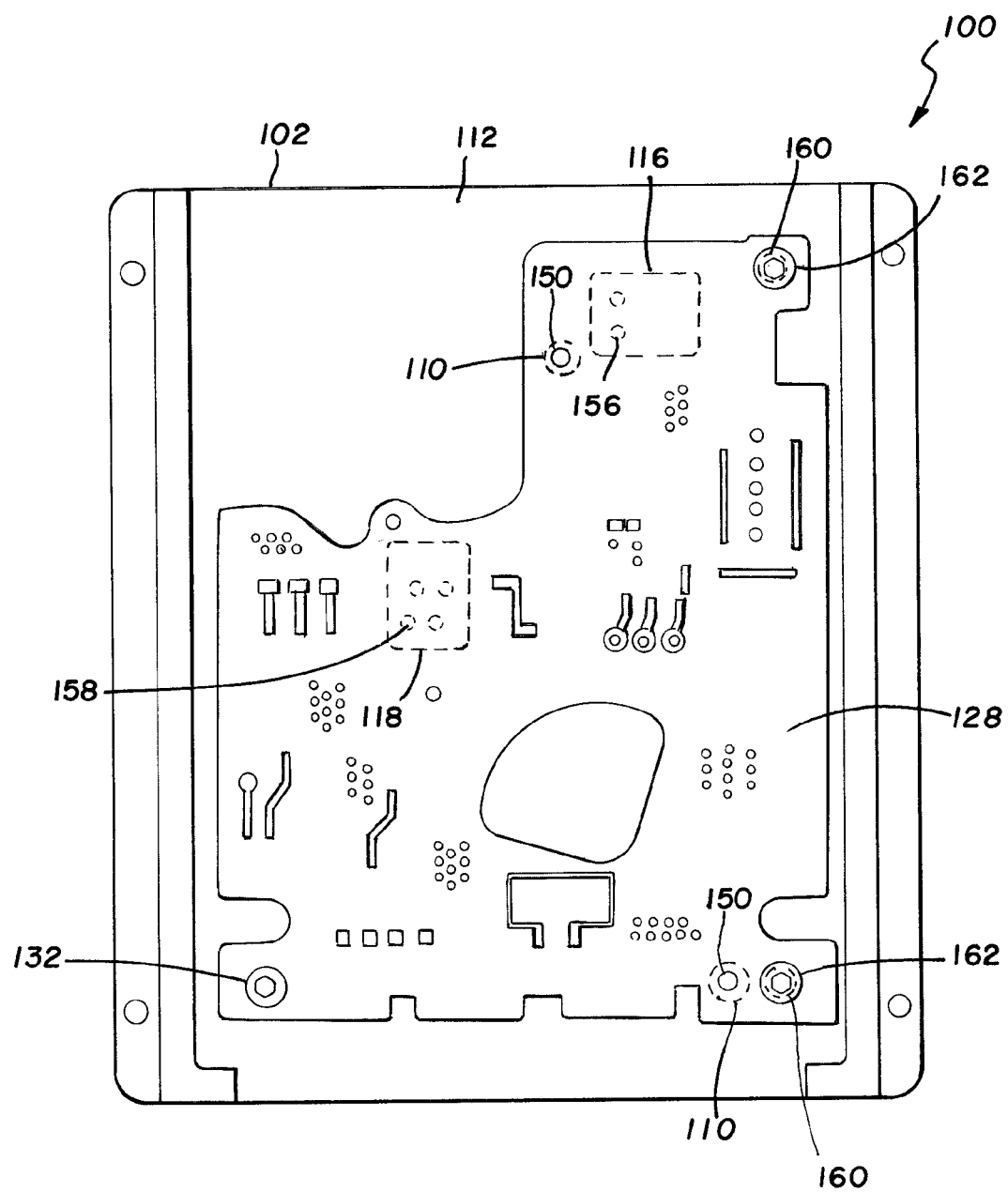
FIG. 5 depicts a printed circuit board secured to a fixture according to an embodiment.

Furthermore, in an embodiment, the printed circuit board 128 includes a plurality of securing member guides 160 corresponding to the securing members 108. In an embodiment, the securing member guides comprises a hole. In an embodiment, the hole is sized such that at least a portion of the securing members 108 can pass through the hole. In an embodiment, the securing members 108 include reception units 132, as shown in FIG. 1, which cooperate with fasteners 162, as shown in FIG. 5, in order to secure the printed circuit board 128 to the fixture 100.

In an embodiment, the reception units 132 comprise threaded screw holes while the fasteners 162 comprise screws. In an embodiment, the reception units 132 or the fasteners 162 can comprise acetal resin, plastic, or metallic materials. In an embodiment, the acetal resin is Dupont™ Delrin®. In an embodiment, the securing members 108 ensure that the printed circuit board 128 maintains its proper alignment based on the alignment posts 110. In an embodiment, the securing members 108 also secure the printed circuit board 128 closely to the fixture 100.

In an embodiment, the securing members 108 secure the printed circuit board 128 to the fixture 100 such that sufficient pressure is placed by the printed circuit board 128 onto the first set of contacts 104 and the second set of contacts 106 so that the first set of contacts 104 and the second set of contacts 106 are in good electrical contact with the spindle motor contacts 156 and the head stack assembly contacts 158, respectively. In an embodiment, the securing members 108 could be other types of devices which sufficiently maintain the alignment of the printed circuit board 128 with the fixture 100 and sufficiently secures the printed circuit board 128 with the fixture 100 such that the first set of contacts 104 and the second set of contacts 106 are in good electrical contact with the spindle motor contacts 156 and the head stack assembly contacts 158, respectively.

Figure 6:
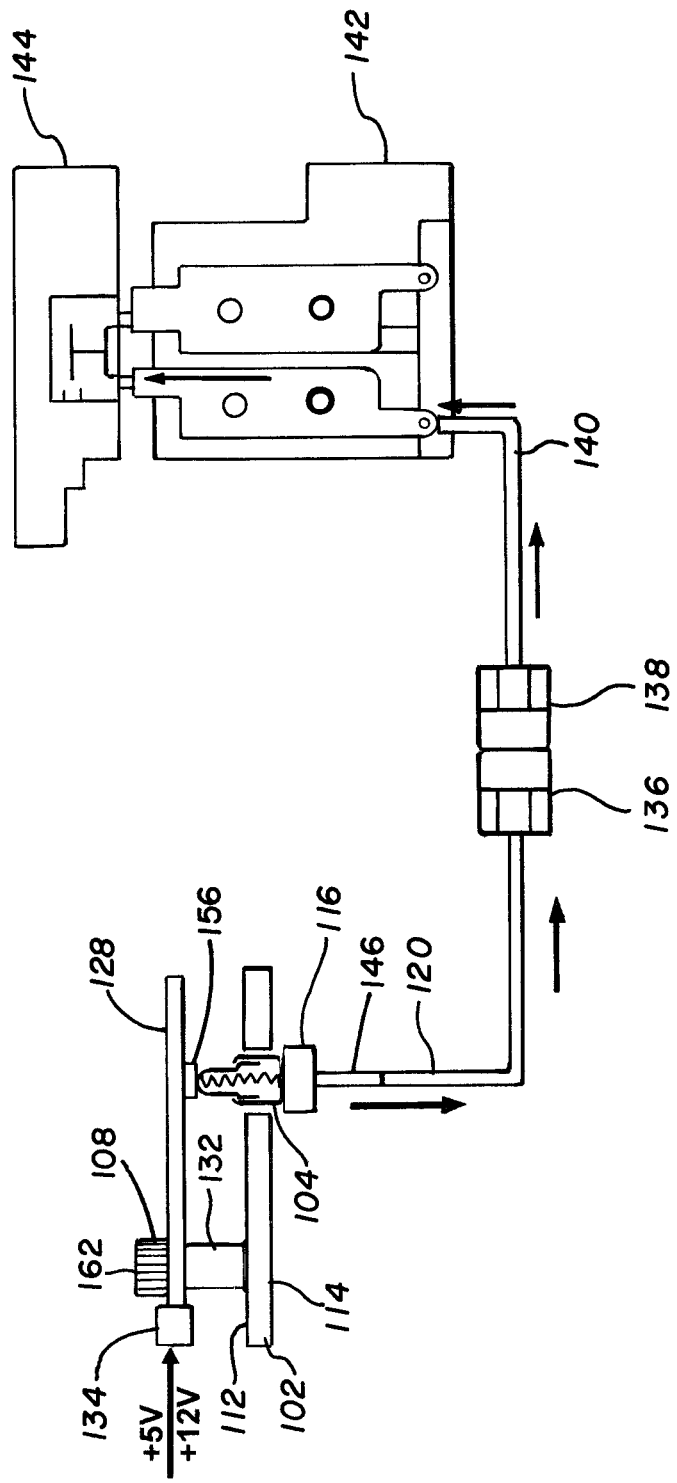
FIG. 6 depicts a printed circuit board secured to a fixture and electrically connected to a storage device test equipment and a disk drive component according to an embodiment.

In an embodiment, a schematic diagram depicting the printed circuit board 128 secured to the fixture 100 and electrically connected to a storage device test equipment 142 and a disk drive component 144 is shown in FIG. 6. In an embodiment shown in FIG. 6, the disk drive component 144 is a spindle motor. However, the disk drive component 144 could also be a head stack assembly, or other component in a data storage device. In an embodiment, the disk drive component 144 is a component of a disk drive which can be controlled by the printed circuit board 128 and which needs to be tested. In an embodiment, the storage device test equipment 142 is a tilt and twist tool. However, the storage device test equipment 142 can be any test equipment capable of being electrically connected to the printed circuit board 128 and testing the disk drive component 144.

As shown in FIG. 6, the storage device test equipment 142 is electrically connected to the disk drive component and the printed circuit board 128. In an embodiment, the storage device test equipment is electrically connected to the disk drive component 144 through pogo pins or other biased pins in a solderless manner. Furthermore, as shown in FIG. 6, the storage device test equipment 142 is connected to the printed circuit board using wires 140 and a connection unit 138. The connection unit 138 of the storage device test equipment 142 is electrically connected to a connection unit 136 and wires 120 of the printed circuit board 128. In an embodiment, the connection unit 136 and the connection unit 138 are Molex connectors. Since the wires 120 are electrically connected to the third set of contacts 146, the connection unit 116, the first set of contacts 104, and the spindle motor contacts 156, the storage device test equipment 142 is electrically connected to the printed circuit board 128.

In an embodiment, the printed circuit board 128 can transmit electrical signals including, for example, instructions to control the spindle motor to the storage device test equipment 142 and the disk drive component 144, when the disk drive component 144 is the spindle motor. The printed circuit board 128 can thus be used to test the spindle motor.

In an embodiment, although not shown in FIG. 6, the wires 122, the fourth set of contacts 148, the connection unit 118, the second set of contacts 106, and the head stack assembly contacts 158 are also electrically connected to the storage device test equipment 142 in a similar manner. Thus, the printed circuit boards 128 can transmit electrical signals including, for example, instructions to control the head stack assembly to the storage device test equipment 142 and the disk drive component 144, when the disk drive component 144 is the head stack assembly. The printed circuit board 128 can therefore be used to test the head stack assembly.

As shown in FIG. 6, the printed circuit board 128 is powered by a power source 134 which can be connected, for example, to an external power supply. In an embodiment, the power source 134 supplies enough power to operate the printed circuit board 128 and to allow the printed circuit board 128 to send the appropriate signals to control the spindle motor and/or the head stack assembly. In an embodiment, the solderless contact between the first set of contacts 104 and the spindle motor contacts 156 reduces unstable current flow from the printed circuit board 128 to the storage device test equipment 142. Similarly, in an embodiment, the solderless contact between the second set of contacts 106 and the head stack assembly contacts 158 reduces unstable current flow from the printed circuit board 128 to the storage device test equipment 142.

Furthermore, in an embodiment, the printed circuit board 128 can have additional disk drive component contacts and the fixture 100 can have additional corresponding contacts which can be made to contact each other in a solderless manner. In such a case, the electrical signals from the printed circuit board 128 can be passed through in a similar manner to the storage device test equipment 142 for use in controlling the operation of the disk drive component 144.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the disclosure is, therefore, indicated by the appended claims rather than by the foregoing description. All changes which come within the meaning and range of equivalency of the claims are to be embraced within their scope.

What is claimed is:

1. A fixture for connecting a printed circuit board for a storage device to a storage device test equipment, the fixture comprising:
    a body;
    a first set of contacts located on the body and configured to contact spindle motor contacts on the printed circuit board in a solderless manner;
    a second set of contacts located on the body configured to contact head stack assembly contacts on the printed circuit board in a solderless manner; and
    a plurality of alignment posts located on the body and configured to align the first set of contacts with the spindle motor contacts and align the second set of contacts with the head stack assembly contacts, wherein the fixture is secured to the printed circuit board.

2. The fixture of claim 1 wherein the first set of contacts and the second set of contacts comprise spring loaded pins.

3. The fixture of claim 2 wherein the spring loaded pins are pogo pins.

4. The fixture of claim 1 wherein the first set of contacts is further configured to connect to an electrical wire connected to the storage device test equipment.

5. The fixture of claim 1 wherein the second set of contacts is further configured to connect to an electrical wire connected to the storage device test equipment.

6. The fixture of claim 1 further comprising a plurality of securing members located on the body and configured to secure the printed circuit board to the fixture.

7. The fixture of claim 1 wherein the body comprises a heat resistant and insulating material.

8. The fixture of claim 7 wherein the body comprises an acetal resin.

9. The fixture of claim 1 wherein the storage device test equipment is a tilt and twist tool.

10. The fixture of claim 1 wherein the storage device is a disk drive.

11. A method for connecting a printed circuit board for a storage device to a storage device test equipment, the printed circuit board comprising spindle motor contacts and head stack assembly contacts, the method comprising securing a feature to the circuit board:
    aligning a first set of contacts in the fixture with the spindle motor contacts and aligning a second set of contacts with the head stack assembly contacts using a plurality of alignment posts in the fixture;
    contacting the spindle motor contacts with the first set of contacts in a solderless manner; and
    contacting head stack assembly contacts with the second set of in a solderless manner.

12. The method of claim 11 wherein the first set of contacts and the second set of contacts comprise spring loaded pins.

13. The method of claim 12 wherein the spring loaded pins are pogo pins.

14. The method of claim 11 further comprising connecting the first set of contacts with an electrical wire connected to the storage device test equipment.

15. The method of claim 11 further comprising connecting the second set of contacts with an electrical wire connected to the storage device test equipment.

16. The method of claim 11 further comprising securing the printed circuit board to the fixture using a plurality of securing members located on a body of the fixture.

17. The method of claim 11 wherein the fixture comprises a heat resistant and insulating material.

18. The method of claim 17 wherein the fixture comprises an acetal resin.

19. The method of claim 11 wherein the storage device test equipment is a tilt and twist tool.

20. The method of claim 11 wherein the storage device is a disk drive.

* * * * *